United States Patent
Ishikawa et al.

(10) Patent No.: US 8,743,702 B2
(45) Date of Patent: Jun. 3, 2014

(54) TEST APPARATUS AND TEST METHOD

(75) Inventors: Shinichi Ishikawa, Saitama (JP);
Masaru Goishi, Saitama (JP); Hiroyasu Nakayama, Saitama (JP); Masaru Tsuto, Saitama (JP)

(73) Assignee: Advantest Corporation, Tokyo (JP)

( * ) Notice: Subject to any disclaimer, the term of this patent is extended or adjusted under 35 U.S.C. 154(b) by 399 days.

(21) Appl. No.: 12/962,569

(22) Filed: Dec. 7, 2010

(65) Prior Publication Data
US 2011/0137606 A1 Jun. 9, 2011

Related U.S. Application Data

(63) Continuation of application No. PCT/JP2009/003159, filed on Jul. 7, 2009, and a continuation-in-part of application No. 12/329,635, filed on Dec. 8, 2008, now Pat. No. 8,059,547.

(51) Int. Cl.
*H04L 1/00* (2006.01)
*H04L 12/26* (2006.01)
*G01R 31/08* (2006.01)

(52) U.S. Cl.
USPC ........ 370/241.1; 370/241; 370/246; 370/248; 370/249; 370/250; 370/252

(58) Field of Classification Search
None
See application file for complete search history.

(56) References Cited

U.S. PATENT DOCUMENTS

| | | | |
|---|---|---|---|
| 5,541,919 A * | 7/1996 | Yong et al. | 370/416 |
| 6,067,651 A | 5/2000 | Rohrbaugh et al. | |
| 6,360,340 B1 | 3/2002 | Brown et al. | |
| 2002/0016941 A1 | 2/2002 | Tsuto | |
| 2002/0059545 A1 | 5/2002 | Nakashima et al. | |
| 2006/0203798 A1* | 9/2006 | Astic et al. | 370/352 |
| 2006/0279274 A1 | 12/2006 | Yamanaka | |
| 2007/0162807 A1 | 7/2007 | Kurayama | |
| 2007/0184839 A1* | 8/2007 | Igarashi et al. | 455/436 |
| 2009/0034416 A1* | 2/2009 | Baron et al. | 370/235 |
| 2009/0059804 A1* | 3/2009 | Fujikami et al. | 370/250 |
| 2010/0110906 A1* | 5/2010 | Ram | 370/252 |

FOREIGN PATENT DOCUMENTS

| | | |
|---|---|---|
| JP | H04-260151 A | 9/1992 |
| JP | 8335610 | 12/1996 |
| JP | 09-264933 | 10/1997 |
| JP | 10-332795 | 12/1998 |
| JP | 11-344528 | 12/1999 |
| JP | 2001067395 | 3/2001 |
| JP | 2001-504626 A | 4/2001 |
| JP | 2001-134469 A | 5/2001 |

(Continued)

OTHER PUBLICATIONS

English translation of Written Opinion (PCT/ISA/237) issued in PCT/JP2009/003159 (parent application) mailed in Jul. 2011.

(Continued)

*Primary Examiner* — Hassan Phillips
*Assistant Examiner* — Lonnie Sweet

(57) ABSTRACT

Provided is a test apparatus that tests a device under test, comprising: a plurality of channels that output and receive signals to and from the device under test; a generating section that generates a packet data sequence transmitted to and from the device under test; and a channel selecting section that selects which of the channels is used to transmit the packet data sequence generated by the generating section.

8 Claims, 19 Drawing Sheets

(56) References Cited

FOREIGN PATENT DOCUMENTS

| | | |
|---|---|---|
| JP | 2001211078 | 8/2001 |
| JP | 2001223680 A | 8/2001 |
| JP | 2001312416 | 11/2001 |
| JP | 2002-050196 A | 2/2002 |
| JP | 2002-152317 A | 5/2002 |
| JP | 2003-67270 A | 3/2003 |
| JP | 2004-120675 A | 4/2004 |
| JP | 2004-253864 A | 9/2004 |
| JP | 2006-268357 A | 10/2006 |
| JP | 2006-352290 A | 12/2006 |
| JP | 2007057541 | 3/2007 |
| JP | 2007-096903 | 4/2007 |
| JP | 2007-166362 A | 6/2007 |
| JP | 2007250124 | 9/2007 |
| JP | 2008-072191 A | 3/2008 |
| TW | I266070 B | 11/2006 |
| TW | I281113 B | 5/2007 |
| WO | 98/22951 A1 | 5/1998 |

OTHER PUBLICATIONS

Evans, "The New ATE: Protocol Aware", Test Conference, 2007. ITC 2007. IEEE International, Oct. 21-26, 2007, pp. 1-10, Santa Clara, CA.
Japanese Office Action dated Jan. 11, 2011, in a counterpart Japanese patent application JP2010-541958. Concise Explanation of Relevance: the Japanese Office Action rejects claims in the Japanese application in view of Foreign Patent document Nos. 1-3 which has English abstract.
International Search Report (ISR) issued in PCT/JP2009/003159 (parent application) mailed in Oct. 2009 for Examiner consideration.
Written Opinion (PCT/ISA/237) issued in PCT/JP2009/003159 (parent application) mailed in Oct. 2009.
Japanese Office Action dated Mar. 23, 2010, in a related Japanese patent application JP2010-504108. Concise Explanation of Relevance: the Japanese Office Action rejects claims in the Japanese application in view of Foreign Patent document Nos. 6-7 and 11-12 which has English abstract.
International Search Report (ISR) issued in PCT/JP2009/006610 (related application) mailed in Mar. 2010 for Examiner consideration.
Written Opinion (PCT/ISA/237) issued in PCT/JP2009/006610 (related application) mailed in Mar. 2010. Concise Explanation of Relevance.
TW Office Action/ Search Report and English Translation Dated Feb. 23, 2013; Application No. 098141756.
TW Office Action/ Search Report and Computer Translation Dated Mar. 12, 2013; Application No. 098141757.
TW Office Action/ Search Report and English Translation Dated Dec. 18, 2012; Application No. 098141940.
TW Office Action/ Search Report and English Translation Dated Mar. 27, 2013; Application No. 098141766.
TW Office Action/ Search Report and Computer Translation Dated Mar. 27, 2013; Application No. 098141936.
CN Office Action/ Search Report and Computer Translation Dated May 3, 2013; Application No. 200980148900.8.
CN Office Action/ Search Report and Computer Translation Dated Jul. 1, 2013; Application No. 200980149135.1.
TW Office Action and Search Report Dated Dec. 11, 2013; Application No. 098141939.
TW Office Action and Search Report Dated Dec. 11, 2013; Application No. 098141937.

\* cited by examiner

PACKET SEQUENCE

| //seq  | packet  | parameter | address |
|--------|---------|-----------|---------|
| IDXI 2 | WRITE_A |           | xxxxxxx |
| NOP    | WRITE_B | n=16      | xxxxxxx |
| IDXI 2 | READ_A  |           | xxxxxxx |
| NOP    | READ_B  | n=32      | xxxxxxx |
| EXIT   | IDLE    |           | xxxxxxx |

FIG. 9

IDLE SEQUENCE

| //seq   | ctrl | data                       |
|---------|------|----------------------------|
| IDXI 7  |      | 0x00 // idle code (7 words) |
| RTN     |      | 0x00 // idle code           |

FIG. 10

WRITE PACKET

| //seq   | ctrl           | data                     |
|---------|----------------|--------------------------|
| NOP     |                | 0x0F // start code       |
| NOP     | REG1=0         | 0x01 // command          |
| IDXI 2  | REG1=REG1^DB1  | DB1 // address (2 words) |
| IDXI 4  | REG1=REG1^DB2  | DB2 // data    (4 words) |
| NOP     |                | REG1//check code         |
| RTN     |                | 0xFF//end    code        |

FIG. 11

| INPUT BIT OPERATIONAL TIMING | b1 | b2 | b3 | b4 | b5 | b6 | ... | b31 | b32 |
|---|---|---|---|---|---|---|---|---|---|
| t1 | S1 | | | | | | | | |
| t2 | | S1 | | | | | | | |
| t3 | | | S1 | | | | | | |
| t4 | | | | S1 | | | | | |
| t5 | | | | | S1 | | | | |
| t6 | | | | | | S1 | | | |
| ⋮ | | | | | | | ⋱ | | |
| t31 | | | | | | | | S1 | |
| t32 | | | | | | | | | S1 |

*FIG. 18A*

| INPUT BIT OPERATIONAL TIMING | b1 | b2 | b3 | b4 | b5 | b6 | ... | b31 | b32 |
|---|---|---|---|---|---|---|---|---|---|
| t1 | S1 | S2 | | | | | | | |
| t2 | | | | | | | | | |
| t3 | | | S1 | S2 | | | | | |
| t4 | | | | | | | | | |
| t5 | | | | | S1 | S2 | | | |
| t6 | | | | | | | | | |
| ⋮ | | | | | | | | | |
| t31 | | | | | | | | S1 | S2 |
| t32 | | | | | | | | | |

*FIG. 18B*

| INPUT BIT<br>OPERATIONAL TIMING | b1 | b2 | b3 | b4 | b5 | b6 | ・・・ | b31 | b32 |
|---|---|---|---|---|---|---|---|---|---|
| t1 | S1 | S2 | S3 | S4 | S5 | S6 | ・・・ | S31 | S32 |
| t2 | | | | | | | | | |
| t3 | | | | | | | | | |
| t4 | | | | | | | | | |
| t5 | | | | | | | | | |
| t6 | | | | | | | | | |
| ⋮ | | | | | | | | | |
| t31 | | | | | | | | | |
| t32 | | | | | | | | | |

*FIG. 18C*

TEST APPARATUS AND TEST METHOD

BACKGROUND

1. Technical Field

The present invention relates to a test apparatus and a test method.

2. Related Art

A device for transmitting packets is known. A test apparatus that tests a device for transmitting packets is also known.

Each packet involved in the packet transmission between devices includes, in addition to the actual data, redundant data such as a start code, an end code, and a check code. Therefore, when testing the device for transmitting packets, the test apparatus must generate a complicated test pattern that includes such redundant data.

The device transmitting the packets performs a handshake with its communication partner. The device transmitting packets may exchange transmission requests and denials, transmission initiation and completion responses, transmission successes and failures, and the like, with the communication partner.

Furthermore, when testing the device transmitting the packets, the test apparatus must perform a handshake with the device under test. While waiting for a response from the device under test during the handshake, the test apparatus must also send idle packets and prepare the next transmission in order to respond quickly. Accordingly, when testing such a device, the test apparatus must generate a complicated test pattern.

When a generating section for generating packets is provided for each pin of a device, the circuit size increases. Furthermore, when communicating with the device, a variety of protocols are used. The packets have different content depending on the protocol used for communication, and therefore a generating section for generating packets must be provided for each protocol used. However, when a plurality of generating sections corresponding to a plurality of protocols are provided for each pin of the device, the circuit size increases even further.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. According to a first aspect related to the innovations herein, provided is a test apparatus that tests a device under test, comprising a plurality of channels that output and receive signals to and from the device under test; a generating section that generates a packet data sequence transmitted to and from the device under test; and a channel selecting section that selects which of the channels is used to transmit the packet data sequence generated by the generating section. Also provided is a test method relating to this test apparatus.

The summary clause does not necessarily describe all necessary features of the embodiments of the present invention. The present invention may also be a sub-combination of the features described above.

BRIEF DESCRIPTION OF THE DRAWINGS

FIG. 9 shows an exemplary test program indicating a packet sequence.

FIG. 10 shows examples of a command sequence for generating an idle packet and a data sequence included in an idle packet.

FIG. 11 shows examples of a command sequence for generating an idle packet and a data sequence included in a write packet.

FIG. 18A shows an exemplary table designating operation of a serializer 72.

FIG. 18B shows an exemplary table designating operation of a serializer 72.

FIG. 18C shows an exemplary table designating operation of a serializer 72.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
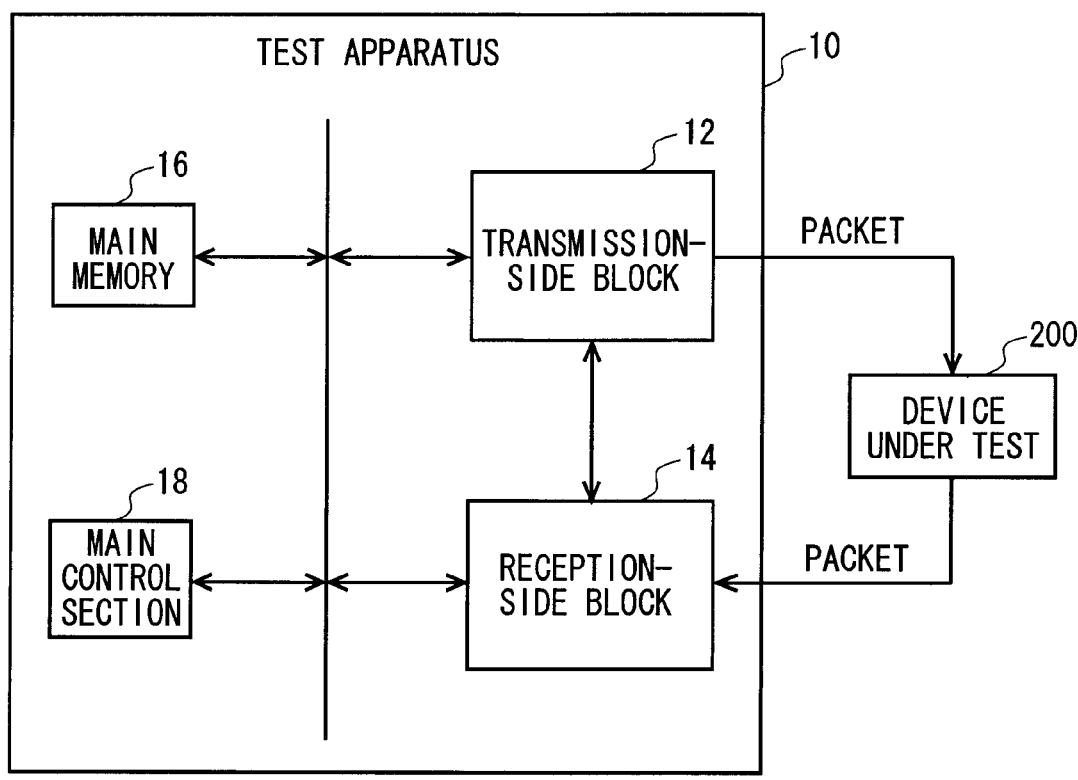
FIG. 1 shows an exemplary configuration of a test apparatus 10 according to an embodiment of the present invention, along with a device under test 200.

FIG. 1 shows an exemplary configuration of a test apparatus 10 according to an embodiment of the present invention, along with a device under test 200. The test apparatus 10 tests the device under test 200 that sends and receives packets.

The test apparatus 10 is provided with a transmission-side block 12, a reception-side block 14, a main memory 16, and a main control section 18. The transmission-side block 12 sends packets to the device under test 200 in an order designated by a test program. The reception-side block 14 receives the packets from the device under test 200 and judges the acceptability of the communication between the test apparatus 10 and the device under test 200.

The main memory 16 stores the test program for testing the device under test 200. More specifically, the main memory 16 stores a test program indicating a packet sequence that designates the order in which the packets are sent to the device under test 200 and received by the device under test 200. The main memory 16 also stores individual data that is included in each packet being sent or received and that is designated independently for each packet.

The main control section 18 transmits the individual data and the test program stored in the main memory 16 to the transmission-side block 12 and the reception-side block 14. The main control section 18 performs overall control of the test apparatus 10, including initiating the test, ending the test, and the like.

Figure 2:
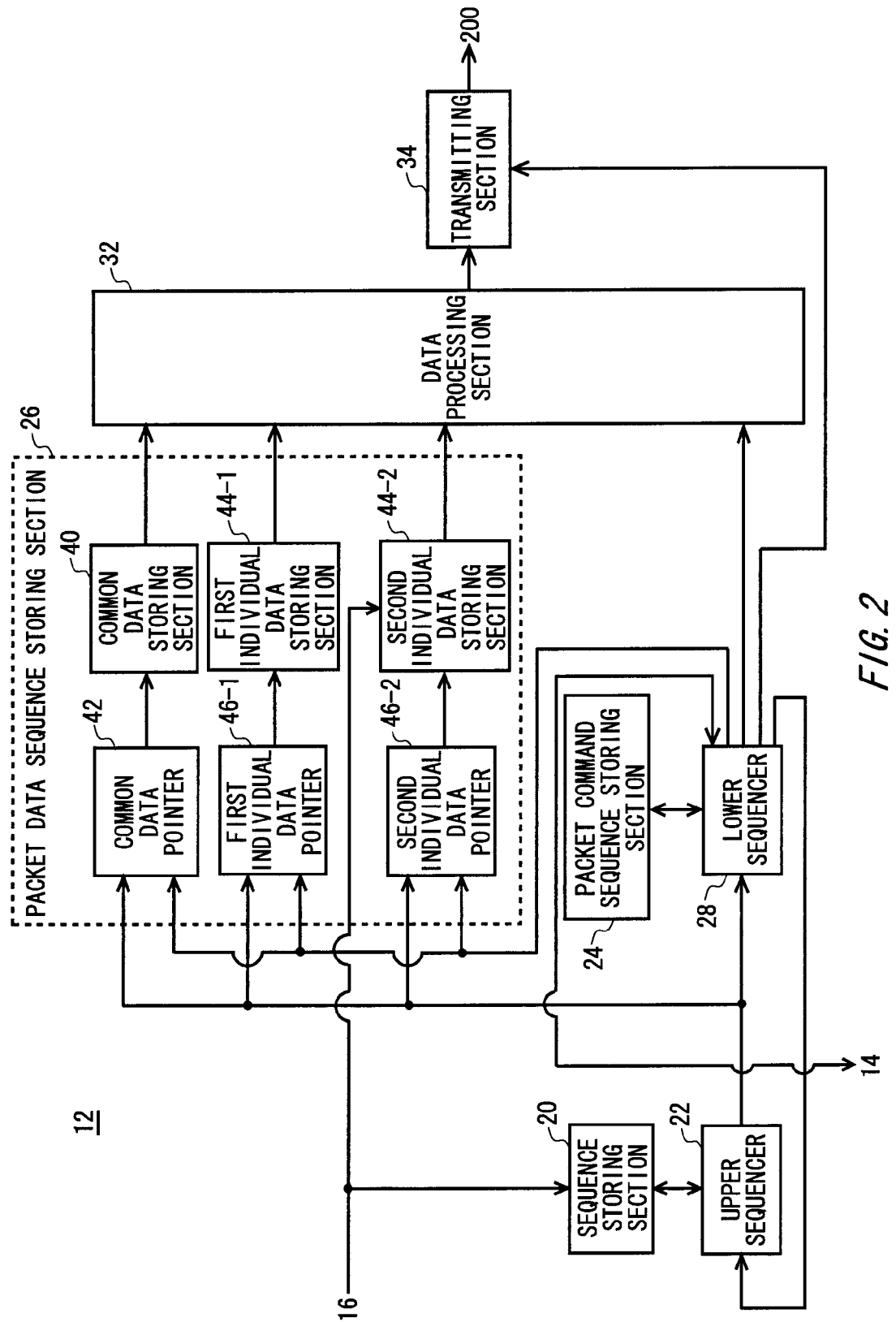
FIG. 2 shows a configuration of the transmission-side block 12.

FIG. 2 shows a configuration of the transmission-side block 12. The transmission-side block 12 includes a sequence storing section 20, an upper sequencer 22, a packet command sequence storing section 24, a packet data sequence storing section 26, a lower sequencer 28, a data processing section 32, and a transmitting section 34.

The sequence storing section 20 stores the test program indicating the packet sequence. The sequence storing section 20 receives the test program from the main memory 16 prior to testing or during testing.

The upper sequencer 22 executes the test program stored in the sequence storing section 20 to designate the order of the packets sent and received to and from the device under test 200. For example, the upper sequencer 22 designates an address, e.g. a beginning address, in the packet command sequence storing section 24 of a command sequence for generating the packets to be transmitted to and from the device under test 200. The upper sequencer 22 may further designate an address, e.g. a beginning address, in the packet data sequence storing section 26 of a data sequence that includes the packets to be transmitted to and from the device under test 200.

In this way, the upper sequencer 22 individually designates an address of a command sequence for generating a packet and an address of a data sequence that includes the same packet. In this case, when a data sequence or a command sequence shared by two or more packets in the test program is designated, the upper sequencer 22 may designate the address of the same data sequence or the same command sequence in the two or more packets.

The packet command sequence storing section 24 stores command sequences for generating each of a plurality of types of packets, in association with each type of packet. For example, the packet command sequence storing section 24 stores a command sequence for generating a write packet, a command sequence for generating a read packet, a command sequence for generating an idle packet, and the like.

The packet data sequence storing section 26 stores data sequences included in each of the plurality of types of packets in association with each type of packet. For example, the packet data sequence storing section 26 stores a data sequence included in a write packet, a data sequence included in a read packet, a data sequence included in an idle packet, and the like.

The packet data sequence storing section 26 may include a common data storing section 40, a common data pointer 42, a first individual data storing section 44-1, a second individual data storing section 44-2, a first individual data pointer 46-1, and a second individual data pointer 46-2. The common data storing section 40 stores common data shared by each type of packet, respectively, and included in the data sequences in each type of packet. For example, the common data storing section 40 stores, for each type of packet, a start code indicating the start of the packet, an end code indicating the end of the packet, a command code identifying the type of the packet, and the like.

The common data pointer 42 acquires, from the upper sequencer 22, the beginning address of the block storing the common data included in the packet designated by the upper sequencer 22. The common data pointer 42 further acquires an offset position in the block from the lower sequencer 28. The common data pointer 42 then supplies the common data storing section 40 with the address determined by the beginning address and the offset position, e.g. the address obtained by adding the offset position to the beginning address, and supplies the data processing section 32 with the common data stored in this address.

The first and second individual data storing sections 44-1 and 44-2 store the individual data that is different for each packet and included in the data sequence in each type of packet. For example, the first and second individual data storing sections 44-1 and 44-2 store the actual data received from the device under test 200 or the actual data sent to the device under test 200, which is included in each packet.

The first individual data storing section 44-1 stores predetermined individual data that is unrelated to the executed test program. The second individual data storing section 44-2 stores individual data that changes depending on the executed test program. For example, the second individual data storing section 44-2 receives the individual data sent from the main memory 16 prior to testing or during testing.

The first and second individual data pointers 46-1 and 46-2 receive, from the upper sequencer 22, the beginning address of the block storing the individual data included in the packet designated by the upper sequencer 22. The first and second individual data pointers 46-1 and 46-2 further acquire an offset position in the block from the lower sequencer 28. The first and second individual data pointers 46-1 and 46-2 supply the first and second individual data storing sections 44-1 and 44-2 with the address determined by the beginning address and the offset position, e.g. the address obtained by adding the offset position to the beginning address, and supplies the data processing section 32 with the individual data stored in this address.

The lower sequencer 28 reads the command sequence of the packet designated by the upper sequencer 22, i.e. the command sequence at the address designated by the upper sequencer 22, from the packet command sequence storing section 24, and sequentially executes each command included in the read command sequence. The lower sequencer 28 sequentially reads the data sequence of the packet designated by the upper sequencer 22, i.e. the data sequence at the address designated by the upper sequencer 22, from the packet data sequence storing section 26 according to the executed command sequence, and generates a test data sequence for testing the device under test 200.

The lower sequencer 28 may supply the common data pointer 42, the individual data pointer 46-1, and the individual data pointer 46-2 with the offset position indicating the position of the data corresponding to the executed command in the block storing the data sequence included in the packet designated by the upper sequencer 22. In this case, the lower sequencer 28 may generate an initial value for the first command and generate the offset position as a count value that increases incrementally each time the executed command changes. The command sequence executed by the lower sequencer 28 desirably does not include a jump forward command, a branch command, or the like. In this way, the lower sequencer 28 can perform fast processing with a simple configuration.

The lower sequencer 28 supplies the data processing section 32 with control data that instructs application of a designated process, e.g. an operation or data conversion, to the individual data and the common data read during each command execution. In this way, the lower sequencer 28 can set a designated portion of the data in the packet designated by the upper sequencer 22 to be the data resulting from the designated process being applied to the read data.

The lower sequencer 28 instructs the data processing section 32 concerning which of the common data, the individual data, and the data processed by the data processing section 32 to output for each command execution. Here, the individual data may be the predetermined individual data that is unrelated to the executed test program or the individual data that changes depending on the executed test program. In other words, for each command execution, the lower sequencer 28 instructs the data processing section 32 concerning which of the common data storing section 40, the first individual data storing section 44-1, the second individual data storing section 44-2, or a register storing the data processed by the data processing section 32 to read and output data from.

In this way, the lower sequencer 28 can generate a data portion to be changed depending on the packet in a packet designated by the upper sequencer 22, based on the individual data read from the individual data storing section 44. The lower sequencer 28 can generate a data portion common to each type of packet in a packet designated by the upper sequencer 22, based on the common data read from the common data storing section 40. The lower sequencer 28 can generate a designated data portion, which is data obtained by applying the designated process to the read data, in a packet designated by the upper sequencer 22.

The lower sequencer 28 may supply the upper sequencer 22 with an end notification indicating that the execution of the command sequence of the packet designated by the upper sequencer 22 is completed. In this way, the upper sequencer 22 can sequentially designate packets according to the progression of the command sequence execution by the lower sequencer 28.

The lower sequencer 28 designates, in the transmitting section 34, edge timings of signals sent to the device under test 200. For example, the lower sequencer 28 supplies the transmitting section 34 with a timing signal that controls the edge timing for each packet.

The lower sequencer 28 communicates with a reception-side lower sequencer 28 in the reception-side block 14 described below in relation to FIG. 5. In this way, the transmission-side lower sequencer 28 in the transmission-side block 12 can perform a handshake with the reception-side lower sequencer 28 in the reception-side block 14 to execute the command sequences in synchronization with the reception-side lower sequencer 28.

For example, the transmission-side lower sequencer 28 notifies the reception-side lower sequencer 28 that the test data sequence of a predetermined packet has been sent to the device under test 200. In this way, the transmission-side lower sequencer 28 can prohibit the judging section 84 from judging the acceptability of the data sequence received by the receiving section 82 while the reception-side lower sequencer 28 is waiting to receive notification from the transmission-side lower sequencer 28.

The transmission-side lower sequencer 28 may receive notification from the reception-side lower sequencer 28 that a data sequence matching the generated test data sequence has been received, and then generate the test data sequence of a predetermined packet. In this way, the transmission-side lower sequencer 28 can send the predetermined packet to the device under test 200 after receiving a prescribed packet from the device under test 200.

The data processing section 32 receives data from the common data storing section 40, the first individual data storing section 44-1, and the second individual data storing section 44-2, applies a process designated by the lower sequencer 28 to the data, and outputs the resulting data as the test data sequence. Depending on the content of the designation by the lower sequencer 28, the data processing section 32 may output the unaltered received data as the test data sequence. An exemplary configuration of the data processing section 32 is described in relation to FIG. 3.

The transmitting section 34 sends the test data sequence output by the data processing section 32 to the device under test 200. An exemplary configuration of the transmitting section 34 is described in relation to FIG. 4.

Figure 3:
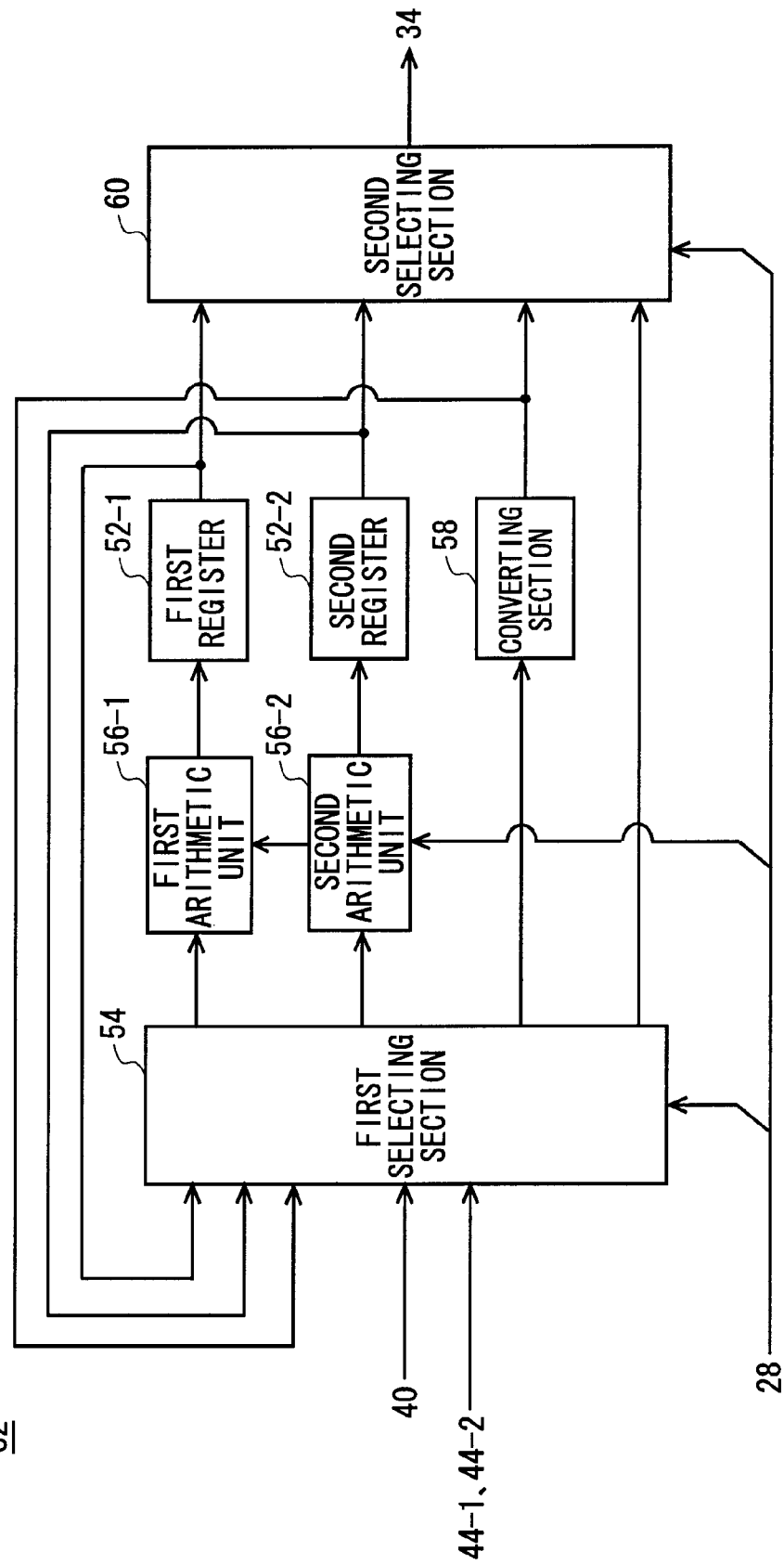
FIG. 3 shows an exemplary configuration of the data processing section 32 in the transmission-side block 12.

FIG. 3 shows an exemplary configuration of the data processing section 32 in the transmission-side block 12. The data processing section 32 in the transmission-side block 12 may include one or more registers 52, a first selecting section 54, one or more arithmetic units 56, a converting section 58, and a second selecting section 60.

Each of the one or more registers 52 stores an operational process result from a previous cycle. In the present embodiment, the data processing section 32 includes a first register 52-1 and a second register 52-2.

The first selecting section 54 selects, for each cycle, the data designated by the lower sequencer 28 from among the common data from the common data storing section 40, the individual data from each of the individual data storing sections 44, i.e. the first individual data storing section 44-1 and the second individual data storing section 44-2, the data from each register 52, i.e. the first register 52-1 and the second register 52-2, and the data output from the converting section 58. Then, for each cycle, the first selecting section 54 supplies the selected data to the arithmetic units 56, i.e. the first register 52-1 and the second register 52-2, the converting section 58, or the second selecting section 60 designated by the lower sequencer 28.

The one or more arithmetic units 56 are disposed to correspond respectively to the one or more registers 52. In the present embodiment, the data processing section 32 includes a first arithmetic unit 56-1 corresponding to the first register 52-1 and a second arithmetic unit 56-2 corresponding to the second register 52-2. Each arithmetic unit 56 may perform such operations as a logical operation, a four arithmetic operation, a pseudo-random number generation, or an error-correcting code generation. For each cycle, each arithmetic unit 56 performs the operation designated by the lower sequencer 28 on the data selected by the first selecting section 54 and stores the result in the corresponding register 52.

The converting section 58 converts the data selected by the first selecting section 54 using a preset table, for each cycle. For example, the converting section 58 performs an 8b-10b data conversion. The converting section 58 outputs the converted data.

The second selecting section 60 selects, for each cycle, the data corresponding to the designated packet from among the data from selected by the first selecting section 54, i.e. the data from the first individual data storing section 44-1 the second individual data storing section 44-2, or the common data storing section 40, the data in the one or more registers 52, and the data output by the converting section 58. The second selecting section 60 outputs the selected data as the test data sequence.

Figure 4:
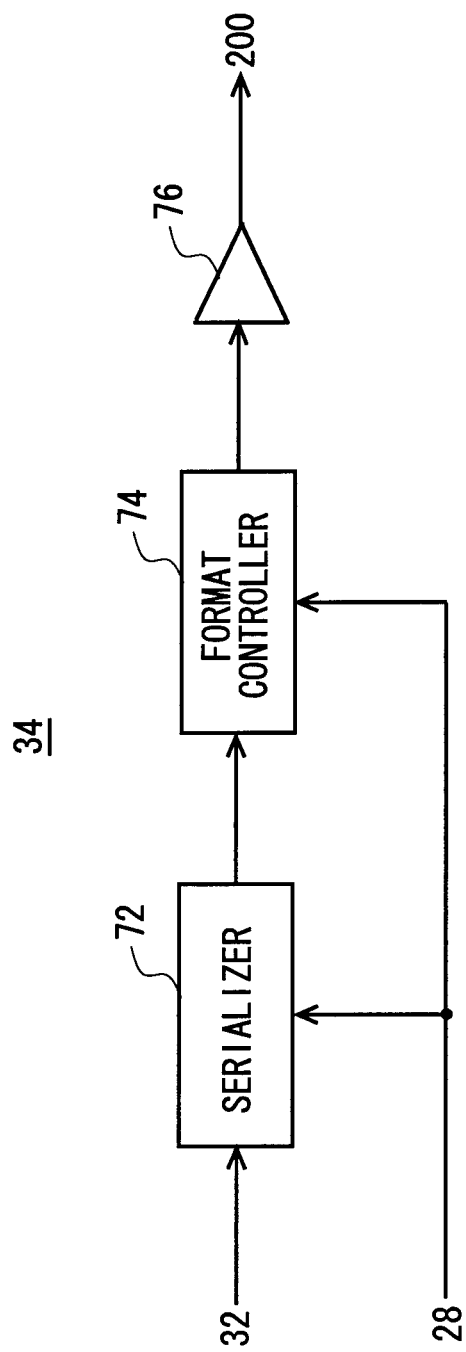
FIG. 4 shows an exemplary configuration of the transmitting section 34 in the transmission-side block 12.

FIG. 4 shows an exemplary configuration of the transmitting section 34 in the transmission-side block 12. The transmitting section 34 may include a serializer 72, a format controller 74, and a driver 76.

The serializer 72 converts the test data sequence received from the data processing section 32 into a serial waveform pattern. The format controller 74 generates a signal with a waveform corresponding to the waveform pattern received from the serializer 72. Furthermore, the signal output by the format controller 74 has a waveform whose logic value changes at the edge timings designated by the lower sequencer 28. The driver 76 supplies the device under test 200 with the signal output by the format controller 74.

Figure 5:
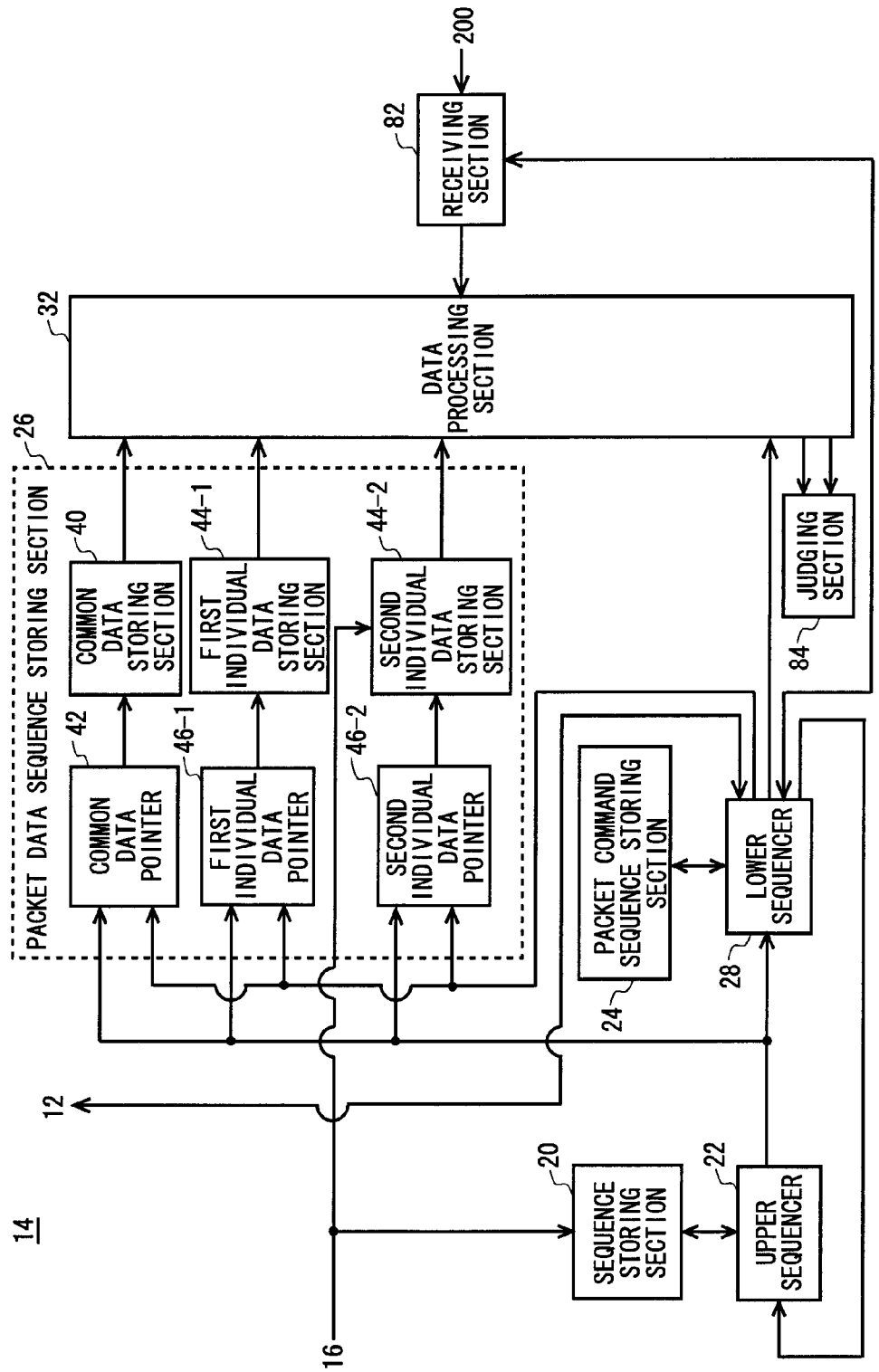
FIG. 5 shows a configuration of the reception-side block 14.

FIG. 5 shows a configuration of the reception-side block 14. The reception-side block 14 has substantially the same function and configuration as the transmission-side block 12 shown in FIG. 2. Therefore, components of the reception-side block 14 that have the substantially same function and configuration as components of the transmission-side block 12 are given the same numerals and the following description includes only differing points.

The reception-side block 14 includes the sequence storing section 20, the upper sequencer 22, the packet command sequence storing section 24, the packet data sequence storing section 26, the lower sequencer 28, the data processing section 32, the receiving section 82, and the judging section 84. The receiving section 82 receives the data sequence of a packet from the device under test 200. An exemplary configuration of the receiving section 82 is described in relation to FIG. 7.

The data processing section 32 in the reception-side block 14 receives the data sequence received by the receiving section 82, and outputs the received data sequence together with the generated test data sequence. An exemplary configuration of the data processing section 32 is described in relation to FIG. 6.

The lower sequencer 28 in the reception-side block 14 outputs a data sequence that is expected to be output by the device under test 200, as the test data sequence. The lower sequencer 28 in the reception-side block 14 sets, in the receiving section 82, a strobe timing for reading the data values of the signal output by the device under test 200.

The judging section 84 receives, from the data processing section 32, the test data sequence and the data sequence received by the receiving section 82. The judging section 84 judges the acceptability of the communication with the device under test 200 based on a result obtained by comparing the data sequence received by the receiving section 82 to the test data sequence. For example, the judging section 84 includes a logic comparing section that determines whether the data sequence received by the receiving section 82 and the test data sequence are the same, and a fail memory that stores the comparison result.

The lower sequencer 28 in the reception-side block 14 communicates with the transmission-side lower sequencer 28 in the transmission-side block 12 shown in FIG. 2. In this way, the reception-side lower sequencer 28 in the reception-side block 14 performs a handshake with the transmission-side lower sequencer 28 in the transmission-side block 12 to execute the command sequence in synchronization with the transmission-side lower sequencer 28.

For example, the reception-side lower sequencer 28 notifies the transmission-side lower sequencer 28 that a data sequence matching the test data sequence generated by the reception-side lower sequencer 28 has been received. In this way, the transmission-side lower sequencer 28 can receive notification from the reception-side lower sequencer 28 that a data sequence matching the generated test data sequence has been received, and can then generate the test data sequence of the predetermined packet.

The transmission-side lower sequencer 28 may prohibit the judging section 84 from judging the acceptability of the data sequence received by the receiving section 82 until notification is received from the transmission-side lower sequencer 28 that the test data sequence of the predetermined packet has been sent to the device under test 200. In this way, after sending a prescribed packet to the device under test 200, the reception-side lower sequencer 28 can judge whether a response to the prescribed packet has been output from the device under test 200.

Figure 6:
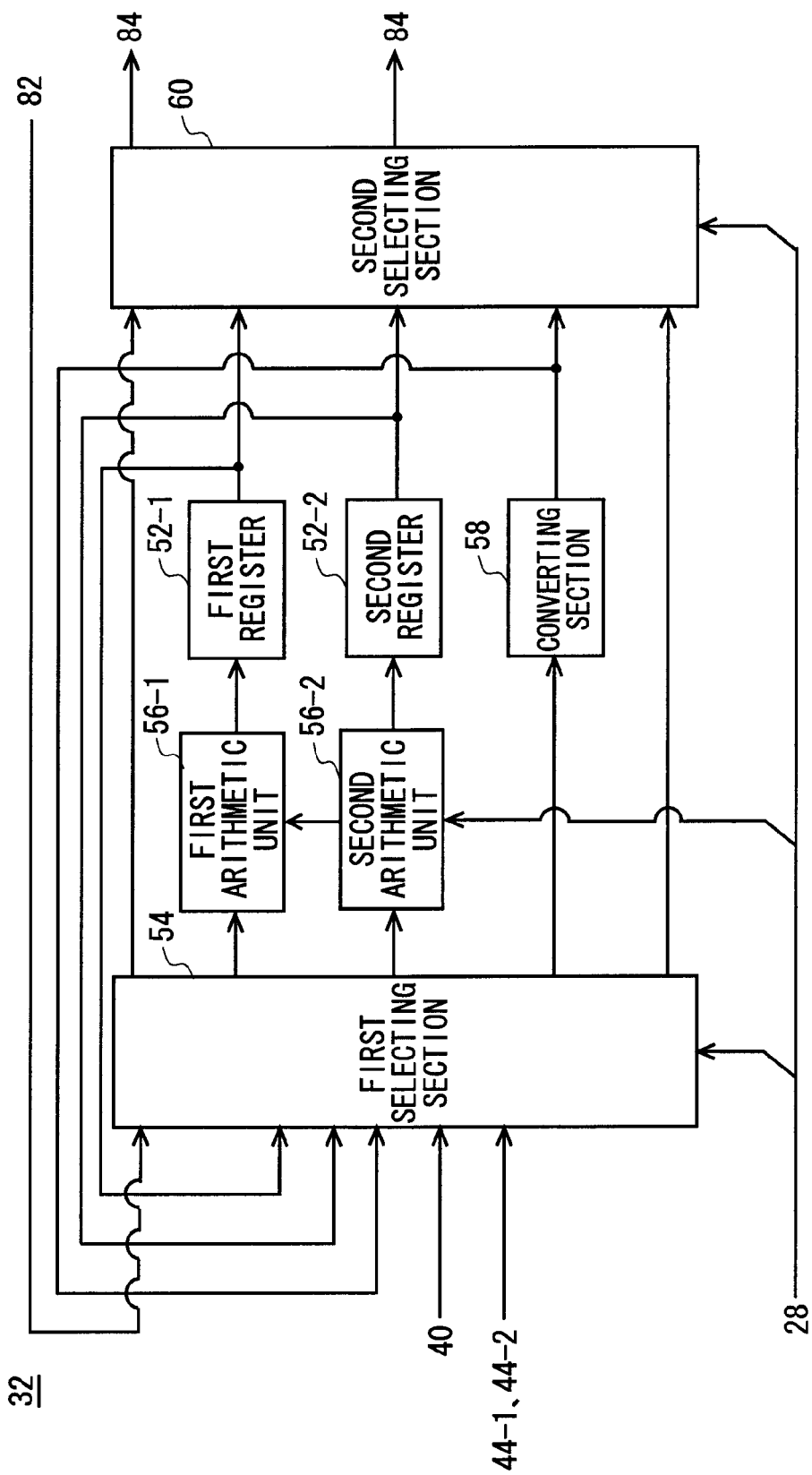
FIG. 6 shows an exemplary configuration of the data processing section 32 in the reception-side block 14.

FIG. 6 shows an exemplary configuration of the data processing section 32 in the reception-side block 14. The data processing section 32 in the reception-side block 14 has substantially the same function and configuration as the data processing section 32 in the transmission-side block 12 shown in FIG. 3. Therefore, components of the data processing section 32 in the reception-side block 14 that have the substantially same function and configuration as components of the data processing section 32 in the transmission-side block 12 are given the same numerals and the following description includes only differing points.

For each cycle, the first selecting section 54 in the reception-side block 14 further supplies the second selecting section 60 with the data received by the receiving section 82. For each cycle, the second selecting section 60 in the reception-side block 14 further outputs the data received by the receiving section 82 and supplied from the first selecting section 54, along with the data of the test data sequence. In this way, the data processing section 32 in the reception-side block 14 can receive the data sequence received by the receiving section 82 and output the received data sequence along with the generated test data sequence.

Figure 7:
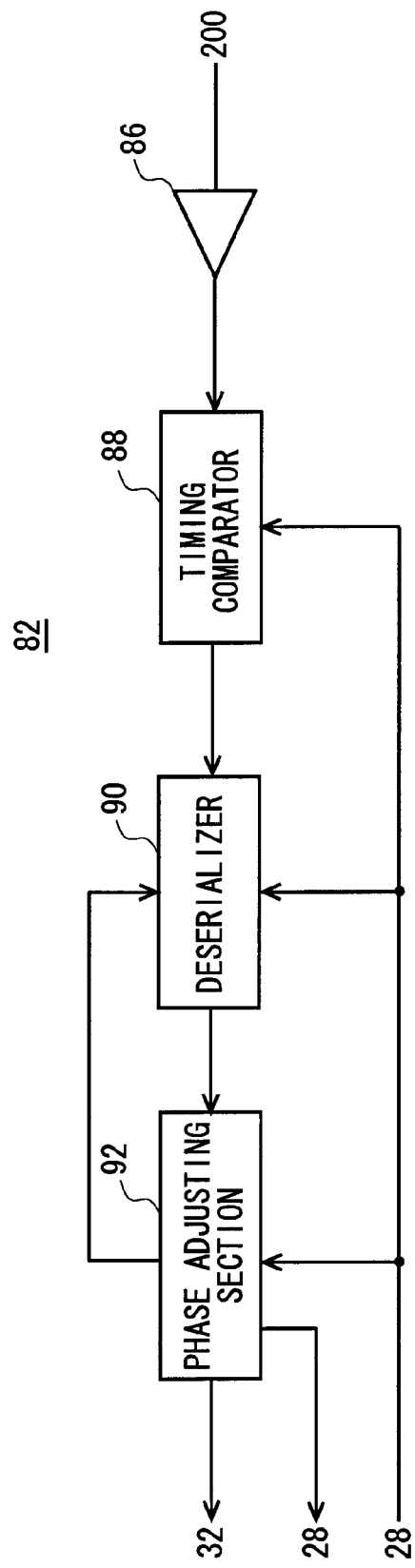
FIG. 7 shows an exemplary configuration of the receiving section 82 in the reception-side block 14.

FIG. 7 shows an exemplary configuration of the receiving section 82 in the reception-side block 14. The receiving section 82 may include a level comparator 86, a timing comparator 88, a deserializer 90, and a phase adjusting section 92.

The level comparator 86 compares the signal output by the device under test 200 to a threshold value and outputs the result as a logic signal. The timing comparator 88 sequentially acquires the data of the logic signal output by the level comparator 86, at timings designated by the lower sequencer 28. The deserializer 90 converts the data sequence acquired by the timing comparator 88 into a parallel test data sequence. The phase adjusting section 92 detects a specification code at the beginning of the packet and adjusts the phase at which the deserializer 90 divides the parallel test data.

Figure 8:
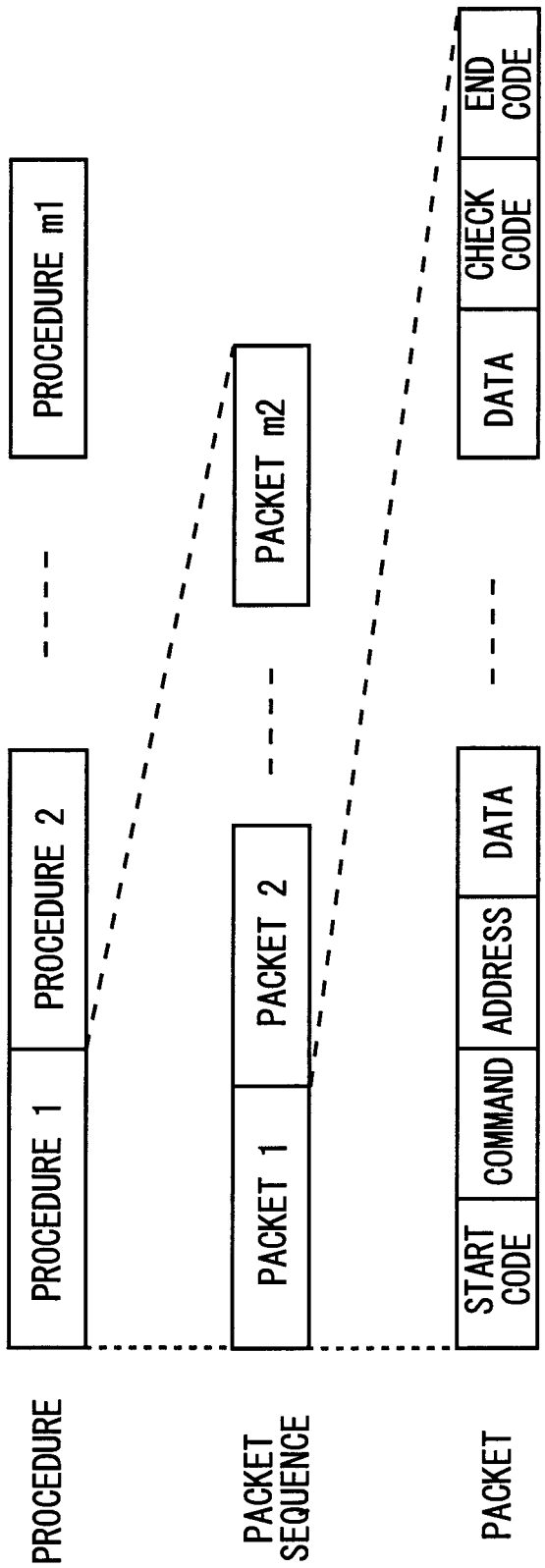
FIG. 8 shows an exemplary data configuration of procedures, a packet sequence, and packets.

FIG. 8 shows an exemplary data configuration of procedures, a packet sequence, and packets. The test apparatus 10 executes a test program that includes one or more procedures in series. Each procedure defines the sequence of the packets sent to the device under test 200 and the sequence of the packets expected to be received from the device under test 200.

The upper sequencer 22 performs such a test program to sequentially designate the packets sent to the device under test 200 and the packets received from the device under test 200. The lower sequencer 28 receives the sequential designation of the packets from the upper sequencer 22, executes the command sequence for generating the designated packets, and generates the data sequences included in the packets.

Each packet includes a start code and an end code, for example. Each packet may further include a command that identifies the type of the packet. These start codes, end codes, and commands are common data shared by all the types of packets. Accordingly, the lower sequencer 28 generates such common data by reading the data from the address designated by the upper sequencer 22 in the common data storing section 40 storing the common data.

Each packet includes actual data such as an address designating a storage position in the device under test 200, write data that is written to the device under test 200, and read data that is read from the device under test 200. Such actual data is individual data unique to each packet. Accordingly, the lower sequencer 28 generates such individual data by reading the data from the address designated by the upper sequencer 22 in the individual data storing section 44 storing the individual data.

Each packet includes a check code or the like for detecting an error in the data included in the packet. Such a check code is calculated by applying an operation to the data included in the packet. Accordingly, the lower sequencer 28 uses the arithmetic unit 56 in the data processing section 32 to generate the check code or the like. Each packet may include data that is converted according to a prescribed rule, such as an 8b-10b conversion. In this case, the lower sequencer 28 uses the converting section 58 to convert the generated data and then outputs the converted data.

FIG. 9 shows an exemplary test program indicating a packet sequence. The upper sequencer 22 may execute a test program including a plurality of commands executed in sequence, a parameter and packet type corresponding to each command, and an address indicating a storage position of a data sequence and a command sequence for generating the corresponding packet type.

This test program may include an NOP command, an IDXI command, an EXIT command, and the like. The NOP command generates the packet associated with the NOP command once, and the next command is then executed. The IDXI command repeatedly generates the packet associated with the IDXI command a designated number of times, and the next command is then executed. The EXIT command generates the packet associated with the EXIT command once, and the execution of the packet sequence is then ended. This test program is not limited to including these commands, and may include other commands such as a branch command that branches the next command to be executed depending on whether a designated condition is fulfilled.

This test program may further include information concerning the packet type for identifying a write packet, a read packet, an idle packet for repeatedly generating a prescribed code, or the like. This test program may include a beginning address at which the command sequence for generating the packet is stored, a beginning address of the common data included in the packet, and a beginning address of the individual data included in the packet.

FIG. 10 shows an example of a command sequence for generating idle packets and a data sequence included in an idle packet. FIG. 11 shows an example of a command sequence for generating an idle packet and a data sequence included in a write packet.

The lower sequencer 28 may execute a command sequence including a plurality of commands executed in sequence, control data corresponding to each command, and information designating a storage location of output data corresponding to each command. This command sequence may identify the storage location of the data as the common data storing section 40, the individual data storing sections 44, the registers 52, or the converting section 58.

In FIGS. 10 and 11, the hexadecimal values 0x0F and 0x01 designate the common data storing section 40 as the data storage location. The value DB1 designates the first individual data storing section 44-1 as the data storage location. The value DB2 designates the second individual data storing section 44-2 as the data storage location. The value REG1 designates the first register 52-1 as the data storage location.

The command sequence includes an NOP command, an IDXI command, a RTN command, and the like. The NOP command outputs the data stored at the address designated by the pointer in the storage location associated with the NOP command one time, and the next command is then executed. The IDXI command repeatedly outputs the data stored at the address designated by the pointer in the storage location associated with the IDXI command a designated of times, and the next command is then executed. The RTN command outputs the data stored at the address designated by the pointer in the storage location associated with the RTN command one time, and the execution then returns to the upper sequencer 22.

The command sequence executed by the lower sequencer 28 desirably does not include a jump forward command, a branch command, and the like. In this way, the lower sequencer 28 can perform fast processing with a simple configuration.

The command sequence includes an operational expression supplied to the arithmetic unit 56 as the control data. In the example of FIG. 11, the command sequence includes an operational expression (REG1=REG1^DB1 or REG1=REG1^DB2) that writes an XOR of the output data and the data in the first register 52-1 back to the first register 52-1. Instead of this expression, the command sequence may include information designating a conversion process performed by the converting section 58 as the control data.

Figure 12:
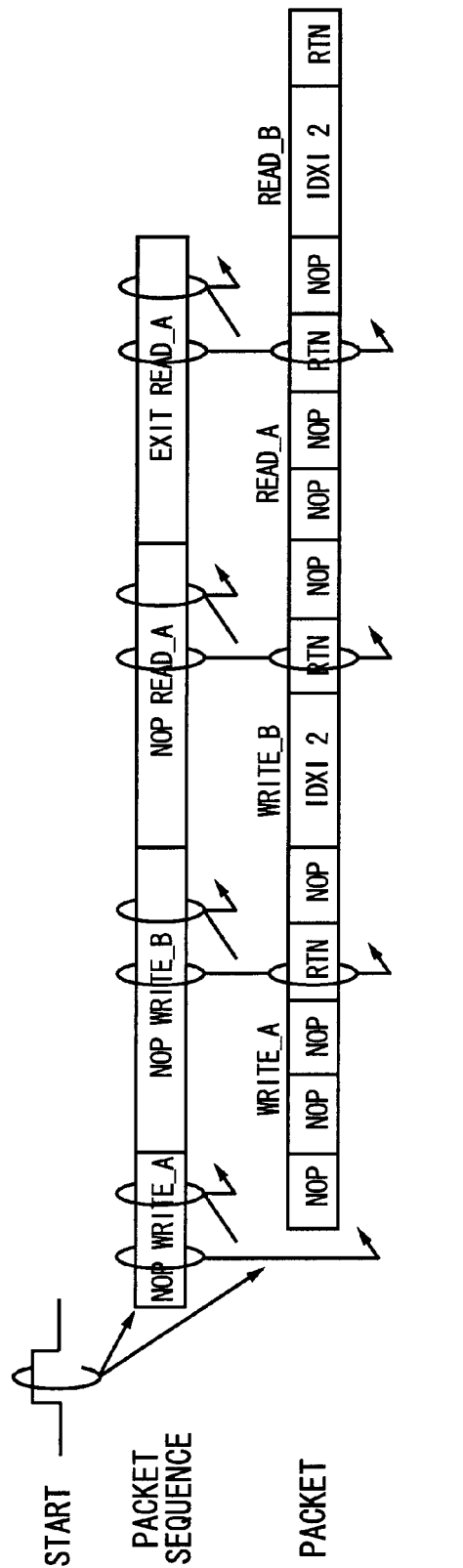
FIG. 12 shows exemplary timings of the processes performed by the upper sequencer 22 and the lower sequencer 28.

FIG. 12 shows exemplary timings of the processes performed by the upper sequencer 22 and the lower sequencer 28. The upper sequencer 22 may start executing the packet sequence upon receiving a start signal from the main control section 18. The upper sequencer 22 designates the packets in the order according to the packet sequence. The lower sequencer 28 executes the command sequence for generating these packets upon receiving the packet designation from the upper sequencer 22.

While the lower sequencer 28 is performing the command sequence of a certain packet, i.e. before the command sequence is completed, the upper sequencer 22 may provide the lower sequencer 28 with the next packet designation. In this way, the lower sequencer 28 can begin executing the command sequence of a certain packet immediately after executing the final command, e.g. the RTN command, of the previous packet. Here, "immediately after" may refer to the subsequent cycle.

Figure 13:
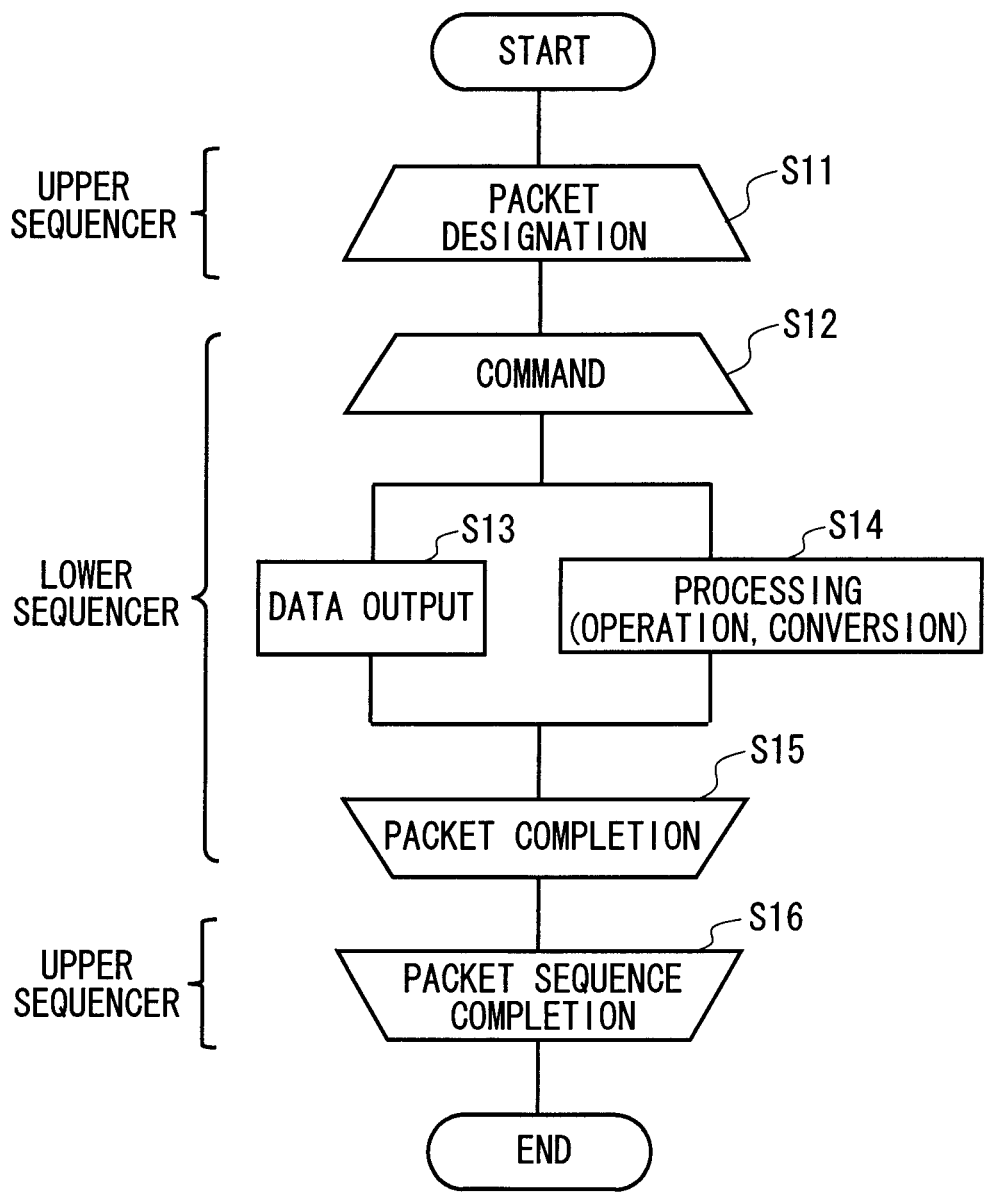
FIG. 13 shows a process flow of the test apparatus 10.

FIG. 13 shows a process flow of the test apparatus 10. First, the upper sequencer 22 executes the test program to sequentially designate the packets sent to and received from the device under test 200 (S11, S16). Upon receiving the packet designation from the upper sequencer 22, the lower sequencer 28 repeatedly executes the processes from step S12 to step S15.

Upon receiving the packet designation, the lower sequencer 28 reads the command sequence for generating the packets from the packet command sequence storing section 24, and performs sequential execution of the commands from the beginning command. When each command is executed, the lower sequencer 28 performs the processes of step S13 and step S14 (S12, S15).

At step S13, the lower sequencer 28 outputs the data corresponding to the current command. At step S14, the lower sequencer 28 performs the operation or data conversion corresponding to the current command. The lower sequencer 28 executes steps S13 and S14 in parallel.

Upon executing the final command, the process flow returns to the upper sequencer 22, which sends the next packet designation to the lower sequencer 28 (S15). Upon completing processing of the final packet in the packet sequence, the upper sequencer 22 ends the process flow (S16).

The test apparatus 10 described in the above embodiment enables the test program indicating the packet sequence and the command sequences in the packets to be executed by separate sequencers. Therefore, using the test apparatus 10 allows the program to be written easily. Furthermore, since the test apparatus 10 can commoditize the data and the command sequences for generating the common packet types, the amount of information stored can be decreased.

The test apparatus 10 according to the above embodiment uses the upper sequencer 22 to individually designate the addresses of the data sequences read by the lower sequencer 28 and the addresses of the command sequences executed by the lower sequencer 28. Therefore, the test apparatus 10 can generate different data sequences from the same command sequence. Accordingly, the test apparatus 10 can decrease the amount of stored information since it is not necessary to store a plurality of the same command sequences.

The test apparatus 10 causes the data processing section 32 to perform the designated process, e.g. an operation or conversion, on the data read from the common data storing section 40 and the individual data storing sections 44. In other words, the data processing section 32 can generate an error detection code and a data conversion to be applied according to a lower layer, e.g. the layer nearest the physical layer, in the packet communication. By generating a data sequence and a command sequence for outputting data in the upper layer in packet transmission and separately designating processes for the lower layer in the packet transmission as described above, the test apparatus 10 allows the program to be easily written and decreases the amount of information stored.

The test apparatus 10 of the present embodiment separates (i) the transmission-side block 12 generating the test data sequence for transmitting signals to the device under test 200 from (ii) the reception-side block 14 generating the test data sequence for comparing the signal received from the device under test 200 with the expected signal, into the upper sequencer 22 and the lower sequencer 28, respectively. The test apparatus 10 allows the respective programs for the reception-side and the transmission-side to be written separately, thereby simplifying the program. The test apparatus 10 can enable communication between the transmission-side lower sequencer 28 and the reception-side lower sequencer 28. In this way, the test apparatus 10 makes it easier to cause the reception-side lower sequencer 28 to begin operating according to a trigger that is an event generated on the transmission-side and to cause the transmission-side lower sequencer 28 to begin operating according to a trigger that is an event generated on the reception-side, for example.

The test apparatus 10 may be provided with a plurality of pairs of transmission-side blocks 12 and reception-side blocks 14. In this case, the main control section 18 provides separate sequences, e.g. separate test programs, to each pair of a transmission-side block 12 and a reception-side block 14, so that each pair can operate independently. In this way, the test apparatus 10 can cause each pair of a transmission-side block 12 and a reception-side block 14 to operate out of synchronization with other pairs.

The main control section 18 may cause each pair of a transmission-side block 12 and a reception-side block 14 to operate in synchronization with the other pairs. In this case, the main control section 18 provides each pair of a transmission-side block 12 and a reception-side block 14 with the same sequence, e.g. the same test program, so that the pairs begin operation in synchronization with each other. In this way, the test apparatus 10 can test in parallel a plurality of devices under test 200 provided with the same type or different types of packet transmission interfaces.

Figure 14:
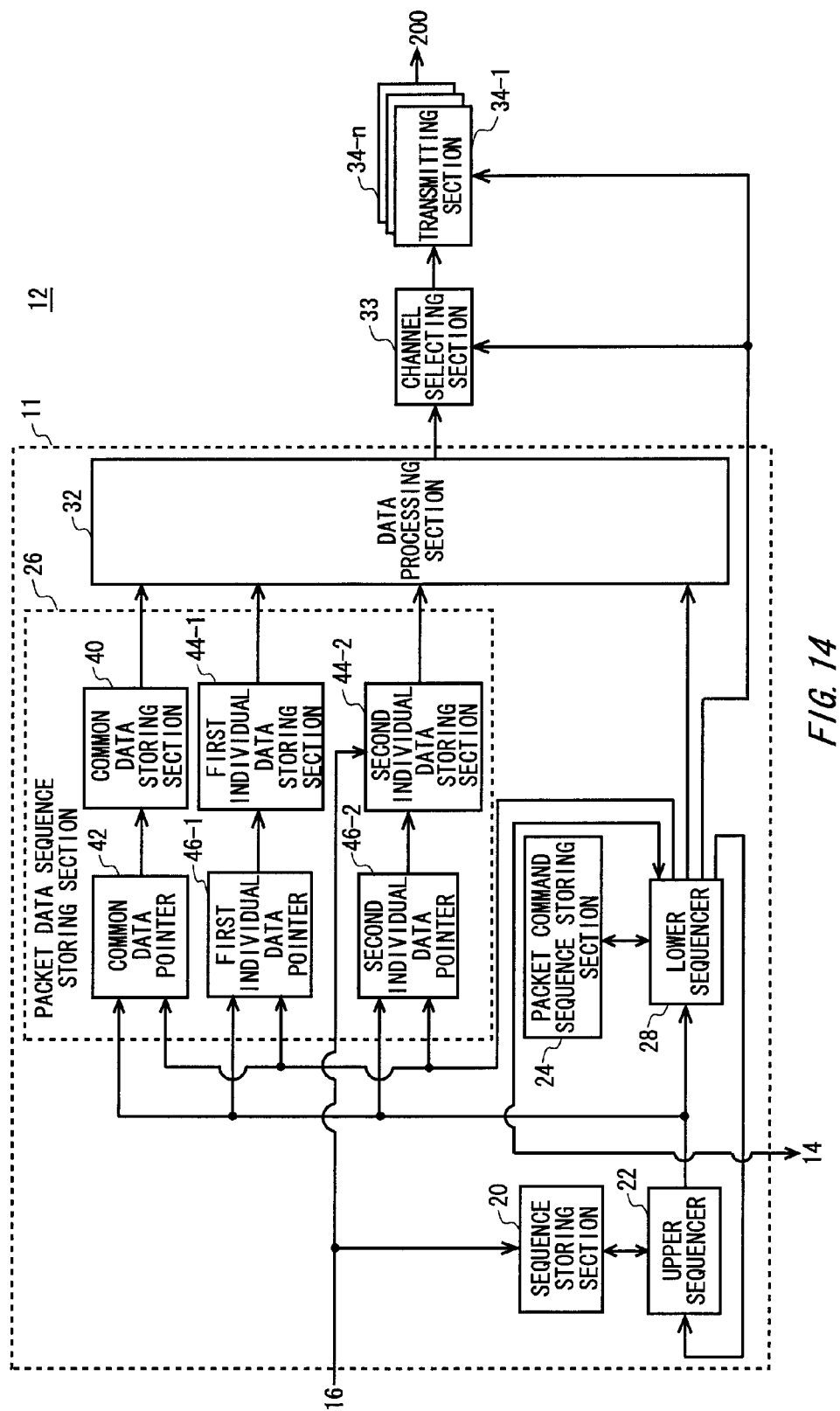
FIG. 14 shows another exemplary configuration of the transmission-side block 12.

FIG. 14 shows another exemplary configuration of the transmission-side block 12. The transmission-side block 12 of the present embodiment includes a generating section 11, a channel selecting section 33, and a transmitting section 34. Aside from the inclusion of the channel selecting section 33, the generating section 11 has the same configuration as the transmission-side block 12 described in relation to FIG. 2.

The transmission-side block 12 of the present embodiment includes a plurality channels of transmitting sections 34. Each transmitting section 34 outputs a signal to a corresponding pin of the device under test 200. The transmitting sections 34 may each include a format controller 74 and a driver 76.

As described in relation to FIG. 2, the generating section 11 generates a data sequence of packets for communicating with the device under test 200. The channel selecting section 33 selects which of the plurality of channels of transmitting sections 34 is used to transmit the packet data sequence generated by the generating section 11. The channel selecting section 33 supplies the selected transmitting section 34 with the packet data sequence received from the generating section 11.

The generating section 11 may generate a data sequence for a plurality of channels. For example, the generating section 11 may generate an M-bit data sequence and supply each bit to a different transmitting section 34, thereby supplying the data sequence to M channels of transmitting sections 34. The channel selecting section 33 selects which transmitting section 34 each bit of the data sequence is supplied to.

The transmission-side block 12 may be capable of communication with the device under test 200 using a variety of protocols. For example, the transmission-side block 12 may be capable of communication with the device under test 200 using protocols corresponding to an interface of each pin of the device under test 200. More specifically, the transmission-side block 12 may be capable of communicating with the device under test 200 using protocols corresponding to interfaces such as JTAG, SMBus, and HT.

The generating section 11 generates packets corresponding to the variety of protocols. The generating section 11 of the present embodiment selects a protocol and generates the packets corresponding to the selected protocol. For example, the generating section 11 may select a protocol corresponding to a pin of the device under test 200 to which the packet is to be supplied. The generating section 11 may select a protocol that is designated by a test program provided by a user or the like.

The channel selecting section 33 selects the channel corresponding to the protocol selected by the generating section 11 and supplies the packet to this channel. The channel selecting section 33 may select a channel designated by the test program, or may select a channel designated by the generating section 11.

Figure 15:
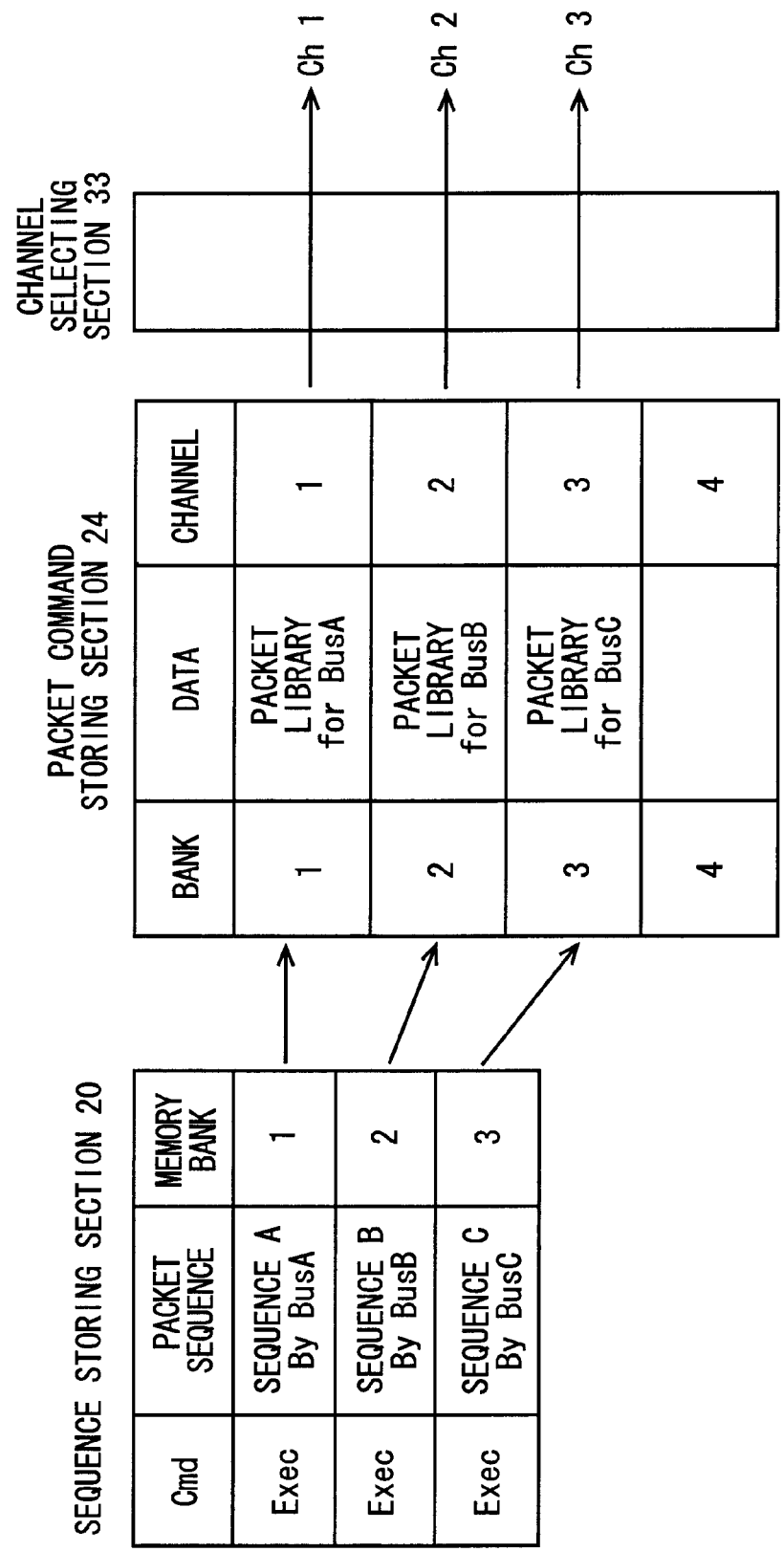
FIG. 15 describes an exemplary operation of the transmission-side block 12 shown in FIG. 14.

FIG. 15 describes an exemplary operation of the transmission-side block 12 shown in FIG. 14. The generating section 11 of the present embodiment includes a packet library, in which data for generating each packet is stored in a different memory bank for each protocol. The packet library may be the packet command sequence storing section 24. In this case, the packet command sequence storing section 24 stores, in each memory bank, a command sequence for generating packets corresponding to each protocol.

The sequence storing section 20 stores each packet sequence in association with memory bank information. As described in relation to FIG. 9, the packet sequence represents an order of packets to be sequentially designated by the upper sequencer 22.

The memory bank information sets, for each packet sequence, a memory bank from which packets are to be read by the lower sequencer 28. In the present example, memory bank 1 is set for sequence A (Bus A), memory bank 2 is set for sequence B (Bus B), and memory bank 3 is set for sequence C (Bus C). Bus A, Bus B, and Bus C represent types of protocols.

The upper sequencer 22 sequentially executes sequence A, sequence B, and sequence C according to a packet sequence stored in the sequence storing section 20. For example, when executing sequence A, the upper sequencer 22 sequentially designates for the lower sequencer 28 the packets indicated by sequence A. The upper sequencer 22 notifies the lower sequencer 28 concerning the corresponding memory bank information for each packet sequence.

The lower sequencer 28 reads the data, i.e. the command sequence, corresponding to the packets designated by the upper sequencer 22, from the memory bank corresponding to the protocol of this packet in the packet command sequence storing section 24. The lower sequencer 28 reads the command sequence of the designated packets from one of the memory banks of the packet command sequence storing section 24, according to the memory bank information supplied from the upper sequencer 22.

Command sequences for generating the same type of packets may be stored at the same address in each memory bank. For example, command sequences for generating read packets may be stored at the same address in each memory bank. The lower sequencer 28 may read the command sequences from the packet command sequence storing section 24 based on the address and memory bank information designated by the upper sequencer 22.

The packet command sequence storing section 24 may store channel information, which indicates which channel each packet is to be transmitted through, for each memory bank. The lower sequencer 28 executes the read command sequence to cause the packet data sequence storing section 26 to generate the data sequence, and supplies the channel selecting section 33 with the channel information corresponding to this command sequence. As a result, designating a memory bank also results in designating a channel.

The packet data sequence storing section 26 generates the data sequences using the same process as the packet data sequence storing section 26 described in relation to FIG. 2. The common data storing section 40, the first individual data storing section 44-1, and the second individual data storing section 44-2 of the present embodiment may each include a plurality of memory banks, in the same manner as the packet command sequence storing section 24. The common data pointer 42, the first individual data pointer 46-1, and the second individual data pointer 46-2 may read data sequences from the memory banks of the corresponding storage sections, based on the memory bank information and addresses designated by the lower sequencer 28.

The channel selecting section 33 selects which channel is used to transmit the packet data generated by the packet data sequence storing section 26 and the data processing section 32, based on the channel information. With this configuration, the device under test 200 can be communicated with using a common transmission-side block 12 for a plurality of protocols. The sequence storing section 20 preferably stores packet sequences of protocols that are not executed in parallel.

Figure 16:
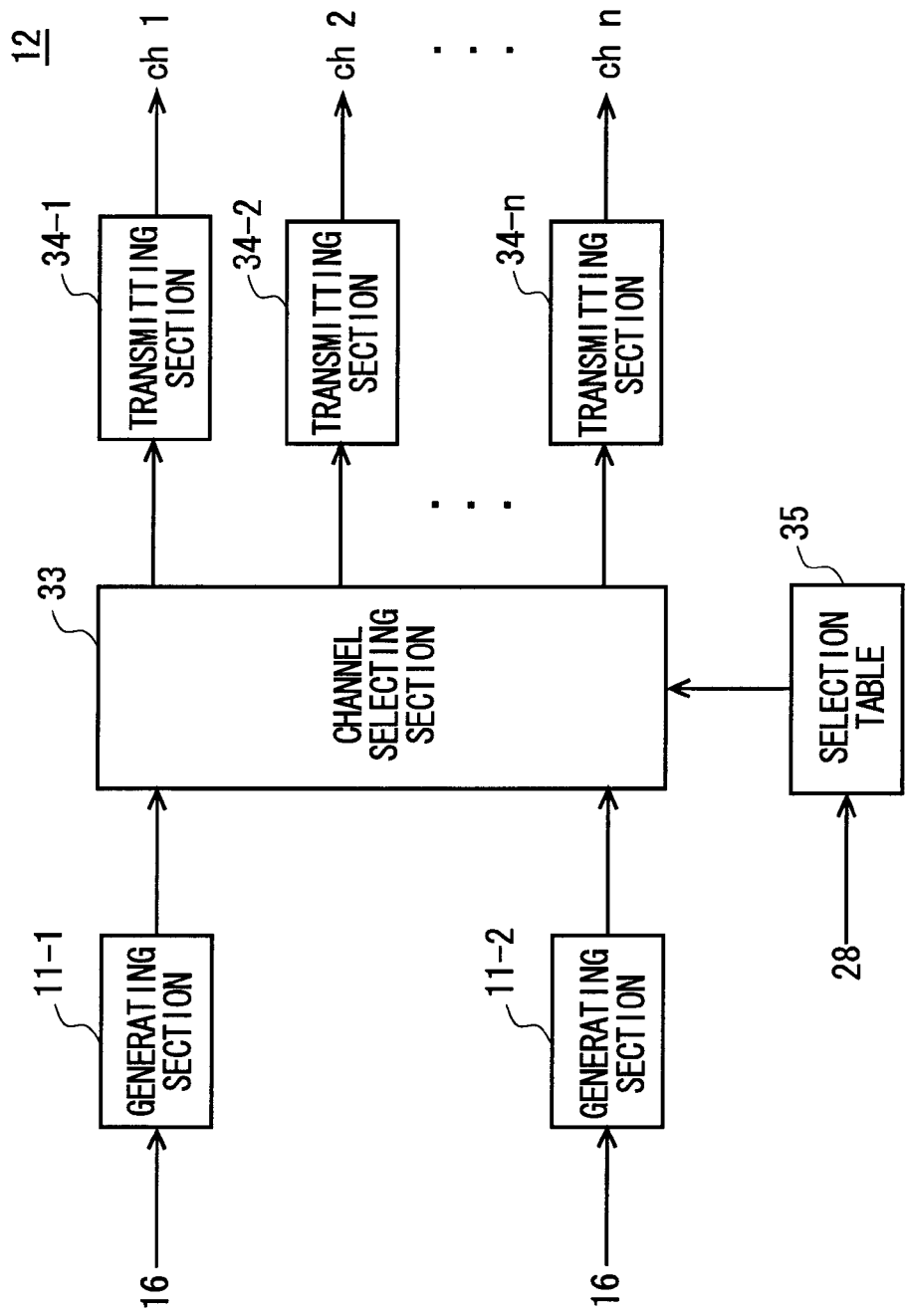
FIG. 16 shows another exemplary configuration of the transmission-side block 12.

FIG. 16 shows another exemplary configuration of the transmission-side block 12. The transmission-side block 12 of the present embodiment includes a plurality of generating sections 11 (two generating sections 11 in this embodiment), a channel selecting section 33, and n channels of transmitting sections 34. The two generating sections 11 are arranged in parallel, and the channel selecting section 33 selects which transmitting section 34 each generating section 11 is connected to.

The channel selecting section 33 stores a selection table 35 for controlling which transmitting section 34 is selected for each generating section 11. The lower sequencer 28 may update the selection table 35 based on the channel information read from the packet command sequence storing section 24.

Figure 17:
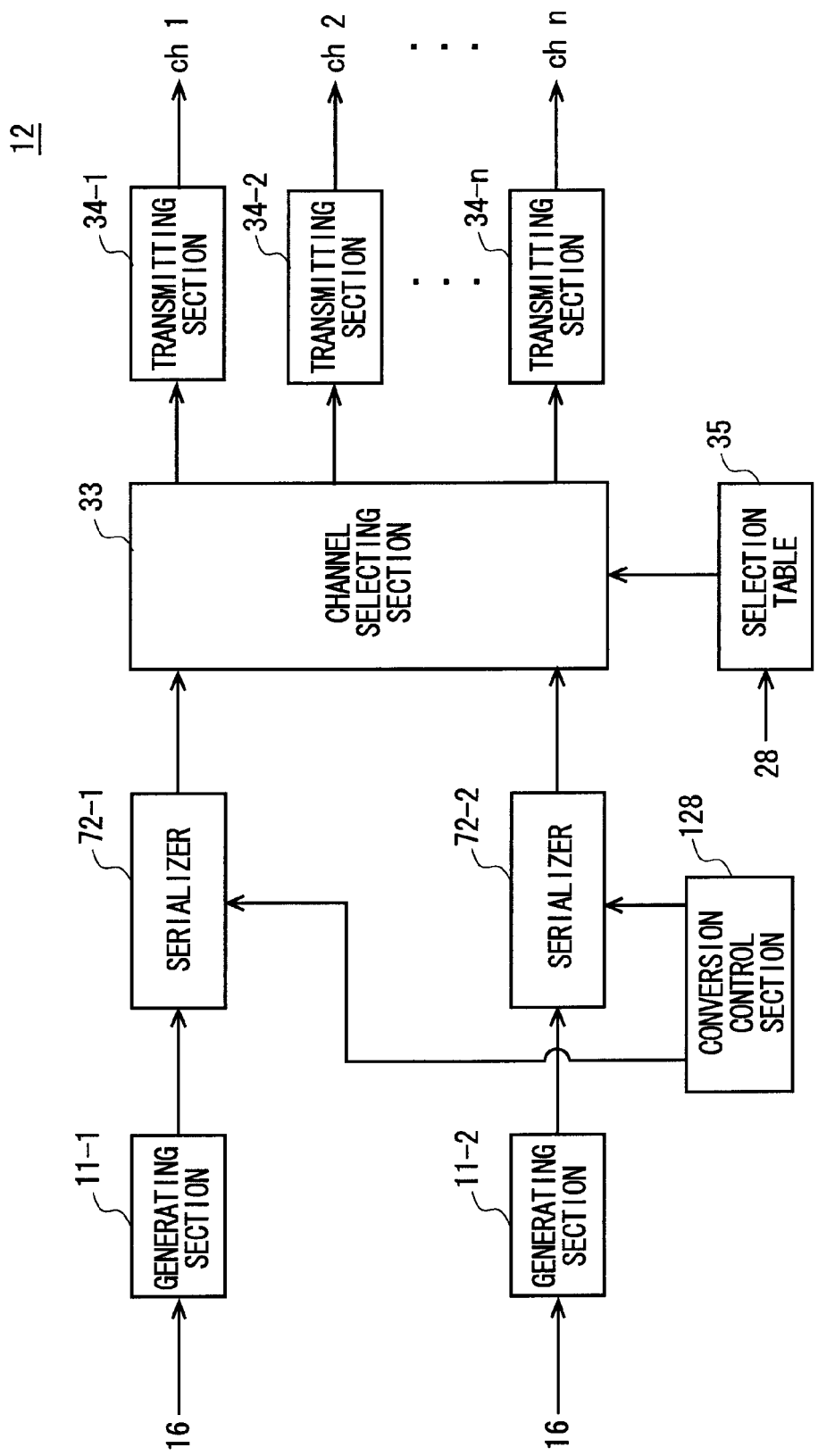
FIG. 17 shows another exemplary configuration of the transmission-side block 12.

FIG. 17 shows another exemplary configuration of the transmission-side block 12. The transmission-side block 12 of the present embodiment further includes a plurality of serializers 72 and a conversion control section 128 in addition to the configuration of the transmission-side block 12 described in relation to FIG. 16. The serializers 72 correspond one-to-one with the generating sections 11.

Each serializer 72 receives N-bit parallel data from the corresponding generating section 11, converts this parallel data into M pieces of serial data, where M is a divisor of N, and outputs the serial data. The M pieces of serial data may be M-bit parallel data.

The conversion control section 128 changes the frequency of the serial data output by each serializer 72 according to the number of pieces of serial data output by the serializer 72. For example, the conversion control section 128 may control the frequency of the serial data to be N/M times the frequency of the parallel data. As a specific example, when a serializer 72 receives 32-bit parallel data at 250 MHz and outputs one piece of serial data, the conversion control section 128 controls the frequency of this serial data to be 250 MHz×32/1=8 GHz.

The conversion control section 128 in this example causes the serializer 72 to output one piece of serial data at 8 GHz, two pieces of serial data at 4 GHz, . . . , 16 pieces of serial data at 500 MHz, or 32 pieces of serial data at 250 MHz. The channel selecting section 33 selects which transmitting section 34 each piece of serial data output by each serializer 72 is supplied to. With this configuration, the number of output pins of the test apparatus 10 and the frequency of the test signal can be changed among many different combinations.

FIG. 18A shows an exemplary table designating operation of a serializer 72. The serializer 72 includes a circuit capable of outputting each bit of each piece of serial data at an operational timing with a period of 1/N with respect to the parallel data. The table designates at which operational timing the serializer 72 outputs each bit of each piece of serial data. The table designates which bit of the parallel data is output by the serializer 72 at each operational timing.

Each column in the table of FIG. 18A indicates one period of bits in the parallel data supplied to the serializer 72. Each row in this table indicates the operational timing at which the bits of the serial data are output by the serializer 72. Each operational timing represents an operational timing obtained by dividing one period of the parallel data by N. In this example, N=32, and the serializer 72 outputs one piece of serial data with a frequency that is 32 times the frequency of the parallel data.

In this case, as shown in FIG. 18A, the table is set such that sequentially, for each period of the parallel data, one bit (S1) of the parallel data is selected and output at each operation timing. According to this table, the serializer 72 sequentially outputs one bit at each operational timing, obtained by dividing the period of the parallel data by 32, from among the 32-bit data received in each period of the parallel data. As a result, the serializer 72 outputs one piece of serial data (S1) having a frequency that is 32 times the frequency of the parallel data.

FIG. 18B shows another exemplary table designating operation of a serializer 72. In this example, the serializer 72 outputs two pieces of serial data with a frequency that is 16 times the frequency of the parallel data.

In this case, as shown in FIG. 18B, the table is set such that sequentially, at every other operational timing, two bits (S1, S2) of the parallel data are selected and output. According to this table, the serializer 72 sequentially outputs two bits at each operational timing, obtained by dividing the period of the parallel data by 16, from among the 32-bit data received in each period of the parallel data.

Each bit output by the serializer 72 corresponds to the serial data. As a result, the serializer 72 outputs two pieces (S1, S2) of serial data with a frequency that is 16 times the frequency of the parallel data. As shown in FIG. 18B, the table may designate which bit of the parallel data is output as which bit (S1, S2) of the serial data.

FIG. 18C shows another exemplary table designating operation of a serializer 72. In this example, the serializer 72 outputs 32 pieces of serial data with a frequency that is equal to the frequency of the parallel data.

In this case, as shown in FIG. 18C, the table is set such that, at one operational timing, all the bits of the parallel data are selected and output in parallel. According to this table, the serializer 72 outputs, in parallel at one operational timing, all 32 bits received in each period of the parallel data.

As a result, the serializer 72 outputs 32 pieces of serial data (S1, S2, ..., S32) with a frequency equal to that of the parallel data. By controlling which operational timing the serializer 72 outputs each bit of the parallel data at, as shown in FIGS. 18A to 18C, serial data can be output with a variety of frequencies using a common sequencer and serializer 72.

In the examples of FIGS. 18A to 18C, the bits of the input parallel data are allocated in order, beginning with the higher bits, as the pieces of serial data S1, S2, etc. (or in order beginning with the higher bits of the output parallel data). However, the bit allocation is not limited to the examples of FIGS. 18A to 18C. The conversion control section 128 may update the table to control which bits of the serial data (or which bites of the output data) the bits of the input parallel data are output as by the serializer 72.

For example, the conversion control section 128 may change which bit on the output side each bit of the parallel data input to the serializer 72 corresponds to, according to specifications of the interface of the device under test 200. As a specific example, the conversion control section 128 may generate output in which the least significant bit is exchanged with the most significant bit of the input data.

The serializer 72 may function as a channel selecting section 33, as a result of the conversion control section 128 controlling which transmitting section 34 is supplied with each piece of serial data output by the serializer 72. In this case, the tables shown in FIGS. 18A to 18C correspond to the selection table 35.

Figure 19:
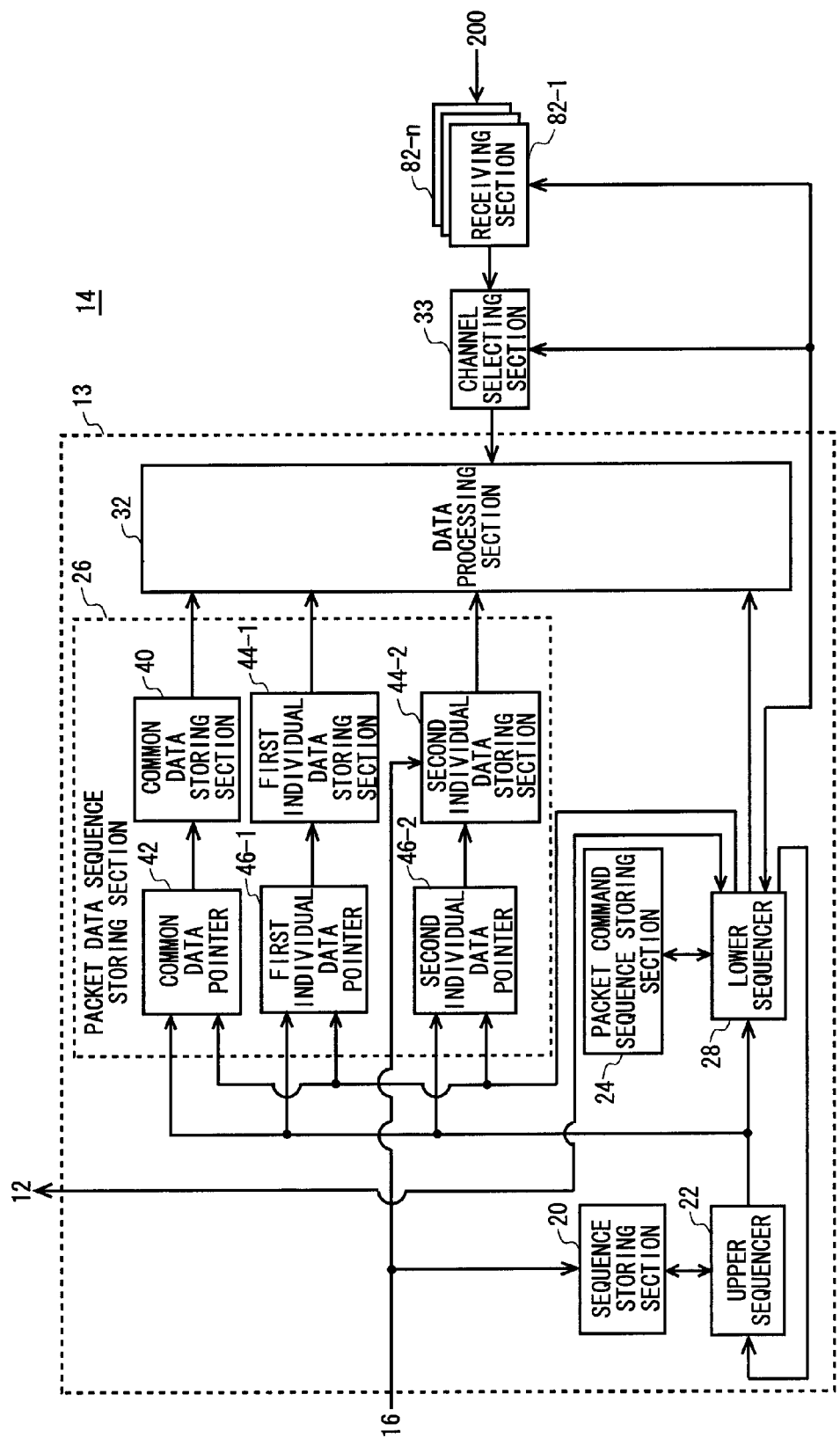
FIG. 19 shows another exemplary configuration of the reception-side block 14.

FIG. 19 shows another exemplary configuration of the reception-side block 14. The reception-side block 14 includes a generating section 13, a plurality of channels of receiving sections 82, and a channel selecting section 33. Aside from the inclusion of the receiving sections 82, the generating section 13 may have the same configuration as the reception-side block 14 described in relation to FIG. 5.

Each receiving section 82 receives a signal from a corresponding pin of the device under test 200. Each receiving section 82 may include a timing comparator 88 and a level comparator 86.

As described in relation to FIG. 5, the generating section 13 generates a data sequence of packets expected to be received. The channel selecting section 33 selects one of the channels and supplies the data processing section 32 with the packet received via this channel.

In the same manner as the transmission-side block 12, the reception-side block 14 may generate data sequences corresponding to a variety of protocols. The generating section 13 selects a protocol and generates the packets corresponding to the selected protocol. The generating section 13 may select the protocol designated by the test program provided by the user or the like.

The channel selecting section 33 selects a channel corresponding to the protocol selected by the generating section 13. The channel selecting section 33 may select the channel designated by the test program, or may select the channel designated by the generating section 13.

The reception-side block 14 may have the same configuration as the transmission-side block 12 described in relation to FIGS. 14 to 18C. For example, the reception-side block 14 may include a plurality of generating sections 13 or a plurality of deserializers 90.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus including a channel selecting section for selecting which of a plurality of channels is used to transmit a packet data sequence, as well as a test method using this test apparatus.

What is claimed is:

1. A test apparatus that tests a device under test, comprising:
    a plurality of channels that output and receive signals to and from the device under test;
    a packet library that stores, in each of a plurality of memory banks corresponding to a plurality of protocols, i) channel information indicating one of the plurality of channels and ii) command sequences for generating packets according to the protocol corresponding to the memory bank, such that command sequences for generating packets of the same type are stored at the same address in each of the plurality of memory banks;
    an upper sequencer that sequentially designates packets to be transmitted to and from the device under test and designates one of the memory banks for each of the designated packets;

a lower sequencer that reads, from the memory banks designated by the upper sequencer, command sequences corresponding to the packets designated by the upper sequencer; and a channel selecting section that selects, from the plurality of channels, which channel each of the packets is to be transmitted through, based on the channel information stored in the memory bank from which the command sequence for generating the packet is read by the lower sequencer.

2. The test apparatus according to claim 1, further comprising a sequence storing section that stores packet sequences, which each indicate an order of the packets to be sequentially designated by the upper sequencer, in association with memory bank information, which designates for each packet sequence the memory bank from which the lower sequencer is to read the command sequences for generating the packets, and the upper sequencer designates, for each packet sequence, the memory bank from which the lower sequencer is to read the command sequences, based on the memory bank information.

3. The test apparatus according to claim 1, further comprising a plurality of generating sections provided in parallel, each of which includes the packet library, the upper sequencer, and the lower sequencer, wherein the channel selecting section selects which channel each of the packets is to be transmitted through for each generating section.

4. The test apparatus according to claim 3, wherein the channel selecting section stores a table for controlling which channel is selected for each generating section, and the lower sequencer updates the table based on the channel information read from the packet library.

5. A method comprising:

storing, in each of a plurality of memory banks correspond to a plurality of protocols, i) channel information indicating one of a plurality of channels for outputting and receiving signals to and from the device under test and ii) command sequences for generating packets according to the protocol corresponding to the memory bank, such that command sequences for generating packets of the same type are stored at the same address in each of the plurality of memory banks;

sequentially designating packets to be transmitted to and from the device under test and designating one of the memory banks for each of the designated packets;

reading, from the designated memory banks, command sequences corresponding to the designated packets;

selecting, from among the plurality of channels which channel each of the packets is to be transmitted through, based on the channel information stored in the memory bank from which the command sequence for generating the packet is read; and transmitting the packets via the selected channel or channels.

6. The method according to claim 5, further comprising storing packet sequences, which each indicate an order of the packets to be sequentially designated, in association with memory bank information, which designates for each packet sequence the memory bank from which the command sequences for generating the packets is to be read, and, for each packet sequence, the memory bank from which the command sequences are to be read is designated based on the memory bank information.

7. The method according to claim 5, wherein a packet library having the memory banks is included in a generating section of a test apparatus, the generating section further including an upper sequencer for performing said sequentially designating packets and a lower sequencer for performing said reading, the generating section is one of a plurality of generating sections provided in parallel, each of which includes the packet library, the upper sequencer, and the lower sequencer, and the method further comprises selecting which channel each of the packets is to be transmitted through for each generating section.

8. The method according to claim 7, further comprising:

storing a table for controlling which channel is selected for each generating section, and updating the table based on the channel information read from the packet library.

* * * * *